（12）United States Patent
Harano et al.

(10) Patent No.: US 7,479,451 B2
(45) Date of Patent: Jan. 20, 2009

(54) DISPLAY DEVICE MANUFACTURING METHOD PREVENTING DIFFUSION OF AN ALUMINUM ELEMENT INTO A POLYSILICON LAYER IN A HEATING STEP

(75) Inventors: Yuichi Harano, Hitachi (JP); Jun Gotoh, Mobara (JP); Toshiki Kaneko, Chiba (JP); Masanao Yamamoto, Mobara (JP)

(73) Assignee: Hitachi Displays, Ltd., Chiba (JP)

( * ) Notice: Subject to any disclaimer, the term of this patent is extended or adjusted under 35 U.S.C. 154(b) by 366 days.

(21) Appl. No.: 11/180,658

(22) Filed: Jul. 14, 2005

(65) Prior Publication Data

US 2005/0250273 A1 Nov. 10, 2005

Related U.S. Application Data

(62) Division of application No. 10/742,896, filed on Dec. 23, 2003, now Pat. No. 6,933,525.

(30) Foreign Application Priority Data

Jan. 9, 2003 (JP) ............................. 2003-002834

(51) Int. Cl.
*H01L 21/44* (2006.01)
(52) U.S. Cl. ..................... 438/656; 438/149; 438/151; 438/652; 438/653; 438/660; 438/663; 438/685; 257/E29.143
(58) Field of Classification Search ................ 438/149, 438/151, 161, 164, 166, 197, 627, 643, 648, 438/653, 656, 658, 660, 663, 685, 688, 775, 438/625, 649, 683, 763, 785, FOR. 352, FOR. 360; 257/383, 763, E29.143
See application file for complete search history.

(56) References Cited

U.S. PATENT DOCUMENTS

| 573,134 | A | | 12/1896 | Burgher |
| 5,061,985 | A | * | 10/1991 | Meguro et al. ............... 257/751 |
| 5,304,829 | A | * | 4/1994 | Mori et al. .................. 257/324 |
| 5,559,344 | A | * | 9/1996 | Kawachi ...................... 257/57 |
| 5,716,871 | A | | 2/1998 | Yamazaki et al. |
| 5,831,281 | A | | 11/1998 | Kurogane et al. |
| 6,040,206 | A | * | 3/2000 | Kurogane et al. ........... 438/149 |
| 6,207,481 | B1 | | 3/2001 | Yi et al. |

(Continued)

FOREIGN PATENT DOCUMENTS

| JP | 9-148586 | 11/1995 |
| JP | 2000-208773 | 1/1999 |

*Primary Examiner*—Zandra Smith
*Assistant Examiner*—Joseph C Nicely
(74) *Attorney, Agent, or Firm*—Reed Smith LLP; Stanley P. Fisher, Esq.; Juan Carlos A. Marquez, Esq.

(57) ABSTRACT

The present invention prevents the diffusion of an aluminum element into a polysilicon layer in a heating step when an aluminum-based conductive layer is used in a source/drain electrode which is in contact with low-temperature polysilicon whereby the occurrence of defective display can be obviated. An aluminum-based conductive layer is used in a source/drain electrode and a barrier layer made of molybdenum or a molybdenum alloy layer is formed between the aluminum-based conductive layer and a polysilicon layer. Further, a molybdenum oxide nitride film formed by the rapid heat treatment (rapid heat annealing) in a nitrogen atmosphere is formed over a surface of the molybdenum or the molybdenum alloy which constitutes the barrier layer.

3 Claims, 8 Drawing Sheets

U.S. PATENT DOCUMENTS

| | | |
|---|---|---|
| 6,255,706 B1 | 7/2001 | Watanabe et al. |
| 6,355,510 B1 | 3/2002 | Kim |
| 6,355,956 B1 | 3/2002 | Kim |
| 6,362,028 B1 | 3/2002 | Chen et al. |
| 6,417,537 B1 * | 7/2002 | Yang et al. .................. 257/310 |
| 6,500,704 B1 * | 12/2002 | Hirano et al. ................ 438/166 |
| 6,509,614 B1 | 1/2003 | Shih |
| 6,664,149 B2 | 12/2003 | Shih |
| 6,833,883 B2 | 12/2004 | Park et al. |
| 7,176,994 B2 * | 2/2007 | Maeda et al. ................ 349/113 |

\* cited by examiner

Result of SIMS on Sample with RTA Treatment on Barrier Layer

FIG. 5

Result of SIMS on Sample without RTA Treatment on Barrier Layer

DISPLAY DEVICE MANUFACTURING METHOD PREVENTING DIFFUSION OF AN ALUMINUM ELEMENT INTO A POLYSILICON LAYER IN A HEATING STEP

CROSS-REFERENCE TO RELATED APPLICATIONS

This application is a Divisional of U.S. Ser. No. 10/742,896 filed Dec. 23, 2003 now U.S. Pat. No. 6,933,525. Priority is claimed based on U.S. Ser. No. 10/742,896 filed Dec. 23, 2003, which claims priority to Japanese Patent Application No. 2003-002834 filed on Jan. 9, 2003, and which is hereby incorporated by reference.

BACKGROUND OF THE INVENTION

The present invention relates to a display device, and more particularly to a display device and a manufacturing method of the same which can enhance reliability thereof by preventing the degradation of characteristics of thin film transistors attributed to the diffusion of an aluminum element into a polysilicon layer during a heating step when an aluminum-based conductive layer is used as a wiring electrode which is brought into contact with the polysilicon layer.

A panel type display device adopting an active matrix method which uses active elements such as thin film transistors or the like (explained hereinafter as thin film transistors) includes pixel regions and peripheral circuits such as driving circuits which are formed in the periphery of the pixel regions. In the thin film transistor which uses an aluminum-based conductive layer as source/drain electrodes thereof, there has been known a thin film transistor in which a molybdenum nitride film is stacked above or below the aluminum electrode layer as a conductive layer forming an electrode which comes into contact with a polysilicon layer and a cross-sectional shape of wet etching is controlled at the time of performing patterning (see JP-A-9-148586). Further, there has been also known a thin film transistor in which a molybdenum film or a titanium nitride film is stacked on both of upper and lower surfaces of an aluminum electrode layer and a cross-sectional shape of the wet etching is controlled in the same manner as the above-mentioned thin film transistor (see JP-A-2000-208773). However, in both of these patent literatures, no consideration has been made with respect to the degradation of the thin film transistor attributed to the diffusion of the aluminum element into the polysilicon layer.

SUMMARY OF THE INVENTION

In the active matrix type display device which is constituted of thin film transistors each using low-temperature polysilicon as an active layer, when aluminum or an aluminum alloy (hereinafter referred to as aluminum-based electrode) is used as source/drain electrodes which are connected to the low-temperature polysilicon layer, in a succeeding heating step of a manufacturing process thereof, the degradation of characteristics of the thin film transistor attributed to the diffusion of an aluminum element to the polysilicon layer is generated and this leads to a defective display.

It is an advantage of the present invention to provide a highly reliable display device which can obviate the generation of defective display by preventing the diffusion of an aluminum element into a polysilicon layer during a heating step when an aluminum-based conductive layer is used as source/drain electrodes which are brought into contact with low-temperature polysilicon (hereinafter simply referred to as polysilicon).

To explain one example of the present invention, an aluminum-based conductive layer is used as source/drain electrodes and a barrier layer formed of molybdenum or a molybdenum alloy layer is interposed between the aluminum-based conductive layer and a polysilicon layer. Further, on a surface (a surface which is in contact with the aluminum-based conductive layer) of the molybdenum or the molybdenum alloy layer which constitutes the barrier layer, a molybdenum oxide nitride film which is formed by rapid heat treatment (the rapid heat annealing) in a nitrogen atmosphere is formed. Further, on an opposite surface of the aluminum-based conductive layer, a cap layer made of molybdenum or a molybdenum alloy layer is formed. Here, it is desirable that an aluminum-based conductive material which constitutes the conductive layer and molybdenum or a molybdenum alloy material which constitutes the cap layer are stacked by continuous sputtering in this order. Here, it is also desirable that a sum of film thicknesses of the barrier layer and the molybdenum oxide nitride film is smaller than a thickness of the cap layer. It is more desirable that the sum of film thicknesses of the barrier layer and the molybdenum oxide nitride film is set to 60% or less of the film thickness of the cap layer.

The molybdenum oxide nitride film which is provided to an interface between the barrier layer and the aluminum-based conductive layer suppresses the diffusion of an aluminum element from the aluminum-based conductive layer into the polysilicon layer whereby the degradation of the characteristics of the thin film transistor can be prevented. In this manner, the present invention can obviate the defective display and can provide a highly reliable display device. Here, the above-mentioned constitution of the source/drain electrode of the present invention is not limited to the thin film transistor arranged in a pixel region and is also applicable to a thin film transistor of a peripheral circuit portion such as a driving circuit.

DESCRIPTION OF THE PREFERRED EMBODIMENTS

Figure 1:
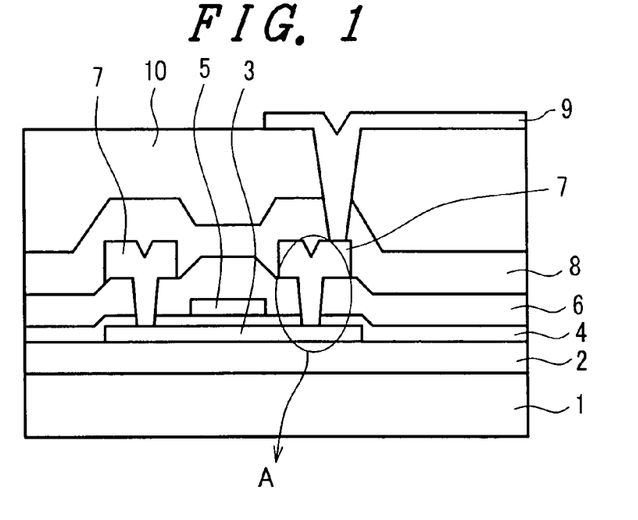
FIG. 1 is a schematic cross-sectional view of a thin film transistor portion which constitutes one pixel of a transmissive type liquid crystal display device for explaining one embodiment of a liquid crystal display device according to the present invention.
Figure 2:
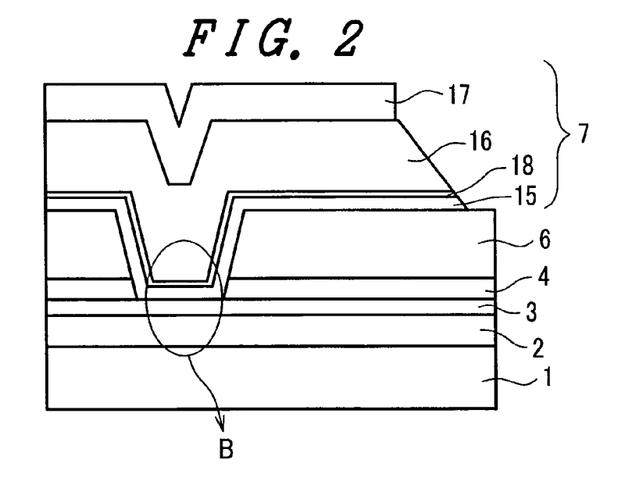
FIG. 2 is an enlarged cross-sectional view of a portion indicated by an arrow A in FIG. 1.
Figure 3:
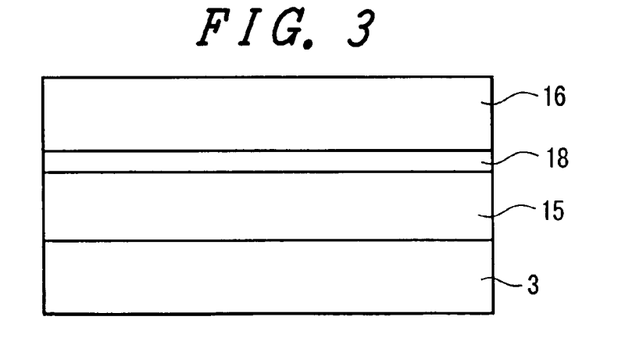
FIG. 3 is an enlarged cross-sectional view of a portion indicated by an arrow B in FIG. 2.

Preferred embodiments of the present invention are explained in detail in conjunction with drawings which show the embodiments in which the present invention is applied to a liquid crystal display device. FIG. 1 is a schematic cross-sectional view of a thin film transistor portion which constitutes one pixel of a transmissive type liquid crystal display device for explaining one embodiment of a liquid crystal display device according to the present invention. Further, FIG. 2 is an enlarged cross-sectional view of a portion indicated by an arrow A in FIG. 1 and FIG. 3 is an enlarged cross-sectional view of a portion indicated by an arrow B in FIG. 2. In FIG. 1 to FIG. 3, numeral 1 indicates a transparent insulation substrate which is preferably made of glass and numeral 2 indicates a background layer. Although not shown in the drawings, the background layer 2 is constituted of a first layer made of silicon nitride (SiN) and a second layer made of silicon oxide layer (SiO). A polysilicon layer 3 is formed over the background layer 2 by patterning and a gate electrode 5 is formed over the polysilicon layer 3 by way of a gate insulation layer (TEOS) 4 which constitutes a first insulation layer. A second insulation layer 6 made of SiO is formed over the gate electrode 5.

A contact hole is formed in the second insulation layer 6 and the first insulation layer 4, while a pair of source/drain electrodes 7 are formed over the second insulation layer 6 by sputtering. One of the source/drain electrodes 7 constitutes a source electrode and another of the source/drain electrodes 7 constitutes a drain electrode corresponding to an operational state of the thin film transistor and hence, the terminology "source/drain electrodes 7" is used. A third insulation layer 8 made of SiN is formed as a layer above the source/drain electrodes 7 and, further, an organic insulation layer 10 is formed over the third insulation layer 8. Then, a contact hole which penetrates the organic insulation layer 10 and the third insulation layer 8 is provided and a transparent electrode (ITO) 9 which constitutes a pixel electrode formed over the organic insulation layer 10 is connected with one of the source/drain electrodes 7 via the contact hole.

As shown in FIG. 2, the source/drain electrode 7 has the laminated structure constituted of a barrier layer 15 made of molybdenum or a molybdenum alloy, an aluminum-based conductive layer 16 and a cap layer 17 made of molybdenum or a molybdenum alloy from a side thereof which is brought into contact with the polysilicon layer 3. Then, as also shown in FIG. 3, a molybdenum oxide nitride film 18 which is formed by the rapid heat treatment (RTA: Rapid Thermal Annealing) in a nitrogen atmosphere is formed in an interface between the barrier layer 15 and the aluminum-based conductive layer 16. The rapid heat treatment is performed by irradiating ultraviolet rays using a UV lamp for 1 to 60 seconds for one portion by relatively moving the substrate and a UV lamp after forming the barrier layer 15. It is desirable to irradiate the ultraviolet rays for 1 to 30 seconds for one portion to enhance the throughput.

Over the molybdenum oxide nitride film 18, the cap layer 17 made of molybdenum or a molybdenum alloy is formed by continuous sputtering thus forming the source/drain electrode 7 formed of a multi-layered laminated film which is constituted of the barrier layer 15, the molybdenum oxide nitride film 18, the aluminum-based conductive layer 16 and the cap layer 17.

Here, the patterning of the source/drain electrode 7 having the multi-layered structure for forming these three layers is performed by a photolithography process and a collective wet etching. It is preferable that a sum of film thicknesses of the barrier layer 15 and the molybdenum oxide nitride film 18 is smaller than a film thickness of the cap layer 17. Further, by setting the sum of film thicknesses of the barrier layer 15 and the molybdenum oxide nitride film 18 to 60% or less of the film thickness of the cap layer 17, it is possible to change the etching cross-sectional shape to an simple tapered shape. Due to such a constitution, the adhesion (coverage) of the third insulation layer 8 which is stacked on the source/drain electrode 7 can be enhanced whereby the reliability is increased. Thereafter, the hydrogen termination annealing treatment (hydrogen termination treatment) is performed. In this termination treatment step, even when an aluminum element contained in the aluminum-based conductive layer 16 tries to diffuse into the polysilicon layer 3, such diffusion is blocked by the molybdenum oxide nitride film 18. Here, an example of numerical values of film thicknesses of the respective layers which constitute the source/drain electrode 7 is as follows. That is, a sum of film thicknesses of the barrier layer 15 and the molybdenum oxide nitride film 18 is 38 nm, the film thickness of the aluminum-based conductive layer 16 is 500 nm, and the film thickness of the cap layer 17 is 75 nm. Further, the film thickness of the molybdenum oxide nitride film 18 is 10 to 20 nm.

Due to the presence of the molybdenum oxide nitride film 18 which has been explained heretofore, even when the sum of film thicknesses of the barrier layer 15 and the molybdenum oxide nitride film 18 which are formed below the aluminum-based conductive layer 16 is small, it is possible to sufficiently prevent the diffusion of the aluminum element.

Here, as the heat treatment step which becomes a cause of the diffusion of the aluminum element, although the hydrogen termination treatment which is explained previously is the most influential cause, as the second influential cause, a CVD process which is used in forming the insulation films is considered.

Figure 4:
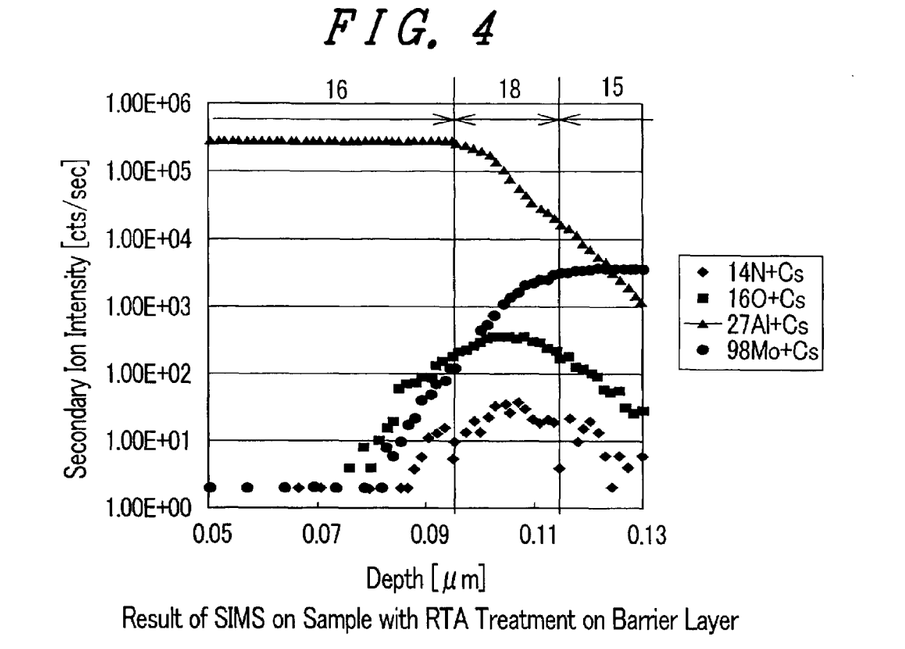
FIG. 4 is an explanatory view showing a result of the measurement of a sample using an SIMS when the rapid heat treatment is applied to a barrier layer in a nitrogen atmosphere.
Figure 5:
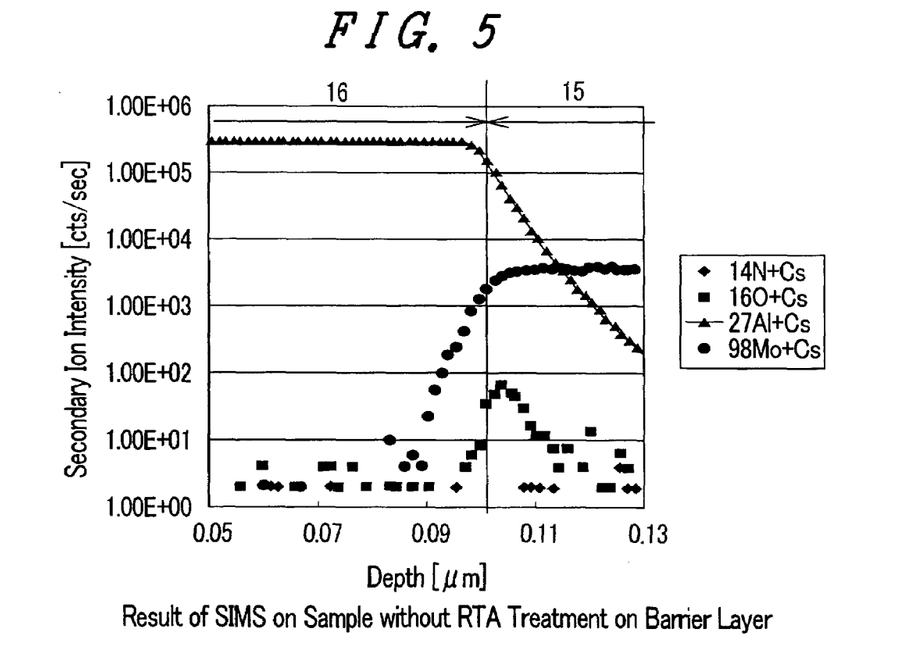
FIG. 5 is an explanatory view showing a result of the measurement of a sample using an SIMS when the rapid heat treatment is not applied to a barrier layer in a nitrogen atmosphere.

FIG. 4 is an explanatory view showing a result of the measurement of a sample using an SIMS when the rapid heat treatment is applied to a barrier layer in a nitrogen atmosphere. Numerals 15, 16, 18 indicate respective regions formed of the barrier layer, the aluminum-based layer and the molybdenum oxide nitride film shown in FIG. 3. FIG. 5 is an explanatory view showing a result of the measurement of a sample using an SIMS when the rapid heat treatment is not applied to a barrier layer in a nitrogen atmosphere. Numerals 15, 16 indicate respective regions formed of the barrier layer and the aluminum-based layer shown in FIG. 3. Further, in FIG. 4 and FIG. 5, a depth (μm) is taken on an axis of abscissas and the intensity of secondary ions (cts/sec) measured by the SIMS is taken on an axis of ordinates.

In FIG. 4, strong peaks of nitrogen and oxygen are observed in the interface between the barrier layer 15 and the aluminum-based conductive layer 16. Based on this phenomenon, the presence of the molybdenum oxide nitride film 18 can be recognized. To the contrary, when the rapid heat treatment in the nitrogen atmosphere is not performed as shown in FIG. 5, it is understood that although a weak peak of oxygen appears in the interface between the barrier layer 15 made of molybdenum or the molybdenum alloy and the aluminum-based conductive layer 16, substantially no nitrogen is present.

Further, to perform the termination annealing treatment of respective samples shown in FIG. 4 and FIG. 5, although the diffusion of the aluminum element into the polysilicon layer is observed with respect to the sample shown in FIG. 5, no diffusion of the aluminum element into the polysilicon layer is observed with respect to the sample shown in FIG. 4.

Further, although not shown in the drawing, based on a result of another experiment, it is confirmed that only with the presence of the molybdenum nitride film, the effect for preventing the diffusion of the aluminum element is not sufficient compared to the presence of the molybdenum oxide nitride film. To be more specific, after performing the rapid heat treatment of the barrier layer 15 in the nitrogen atmosphere, the source/drain electrode 7 is washed with water to dissolve an oxide of molybdenum from the molybdenum oxide nitride film 18 into water so as to form a molybdenum nitride film. Thereafter, aluminum-based conductive layer 16 is formed by sputtering and the termination annealing treatment is performed. As a result, the diffusion of the aluminum element into the polysilicon layer is confirmed.

Based on the result of the above experiment, it is confirmed that even when the sum of film thicknesses of the barrier layer 15 and the molybdenum oxide nitride film 18 is made small, the sufficient barrier property can be ensured due to the aluminum element diffusion prevention effect brought about by the molybdenum oxide nitride film 18.

Figure 6A:
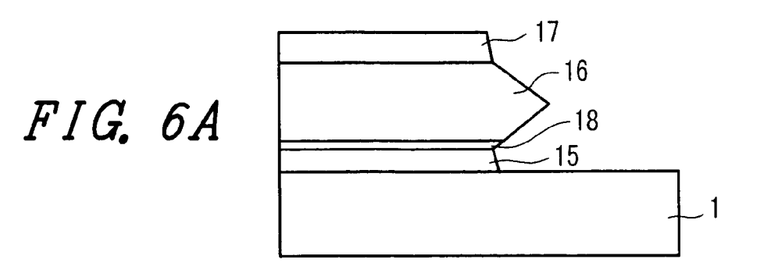
FIG. 6A to FIG. 6C are explanatory views showing an etched cross-sectional shape due to a sum of film thicknesses of a barrier layer and a molybdenum oxide nitride layer and a film thickness of the cap layer after performing a collective wet etching treatment of four layers consisting of an aluminum-based conductive layer, the barrier layer, the molybdenum oxide nitride film and a cap layer.
Figure 6B:
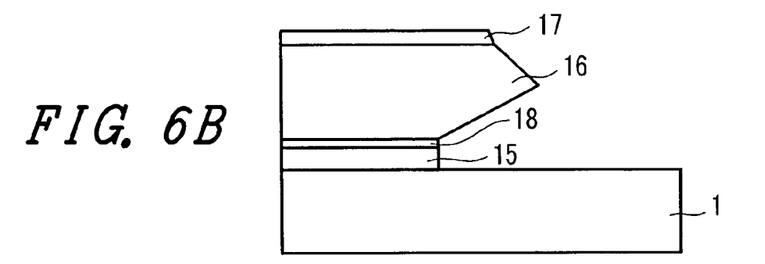
Figure 6C:
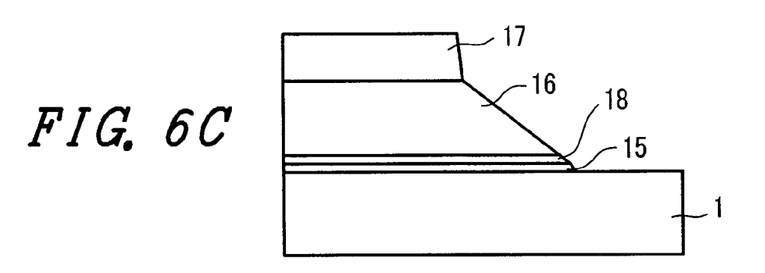

FIG. 6A to FIG. 6C are explanatory views showing an etched cross-sectional shape due to a sum of film thicknesses of a barrier layer and a molybdenum oxide nitride film and a film thickness of the cap layer after performing a collective wet etching treatment of four layers consisting of an aluminum-based conductive layer, the barrier layer, the molybdenum oxide nitride film and a cap layer. FIG. 6A shows a case in which that the sum of the film thicknesses of the barrier layer and the molybdenum oxide nitride film is set as equal to the film thickness of the cap layer, FIG. 6B shows a case in which that the sum of the film thicknesses of the barrier layer and the molybdenum oxide nitride film is set as greater than the film thickness of the cap layer, and FIG. 6C shows a case in which that the sum of the film thicknesses of the barrier layer and the molybdenum oxide nitride film is set as smaller than the film thickness of the cap layer.

As shown in FIG. 6A, when the sum of the film thicknesses of the barrier layer and the molybdenum oxide nitride film is set as equal to the film thickness of the cap layer, since etching rates of the barrier layer 15, the molybdenum oxide nitride film 18 and the cap layer 17 are higher than an etching rate of the aluminum-based conductive layer 16, the aluminum-based conductive layer 16 is not formed into a tapered shape. Further, as shown in FIG. 6B, when the sum of the film thicknesses of the barrier layer and the molybdenum oxide nitride film is set as greater than the film thickness of the cap layer, the barrier layer 15 and the molybdenum oxide nitride film 18 largely cut into with respect to the aluminum-based conductive layer 16 and hence, a cross-sectional shape of the aluminum-based conductive layer 16 is offset to the cap layer 17 having the film thickness smaller than the sum of the film thicknesses of the barrier layer 15 and the molybdenum oxide nitride film 18 in the same manner whereby the aluminum-based conductive layer 16 is not formed into a tapered shape.

To the contrary, as shown in FIG. 6C, when the sum of the film thicknesses of the barrier layer and the molybdenum oxide nitride film is set as smaller than the film thickness of the cap layer, the etching rates of the barrier layer 15 and the molybdenum oxide nitride film 18 are substantially equal to the etching rate of the aluminum-based conductive layer 16 and hence, the aluminum-based conductive layer 16 is formed into a simple tapered shape. Accordingly, by making the sum of the film thicknesses of the barrier layer and the molybdenum oxide nitride film smaller than the film thickness of the cap layer, the adhesion (coverage) of the third insulation layer 8 which is stacked on the source/drain electrode 7 can be enhanced whereby the reliability is increased. In this manner, by making the film thickness of the barrier layer 15 made of molybdenum or the molybdenum alloy and the molybdenum oxide nitride film 18 thin respectively, these layers can have the etching rates substantially equal to the etching rate of the aluminum-based conductive layer 16.

Figure 7:
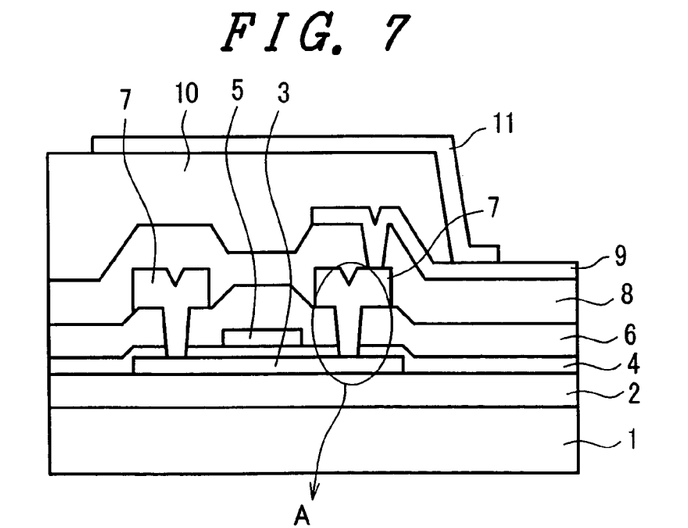
FIG. 7 is a schematic cross-sectional view of a thin film transistor portion which constitutes one pixel of a semi-transmissive type liquid crystal display device for explaining another embodiment of the liquid crystal display device according to the present invention.

FIG. 7 is a schematic cross-sectional view of a thin film transistor portion which constitutes one pixel of a semi-transmissive-type liquid crystal display device for explaining another embodiment of the liquid crystal display device according to the present invention. In the same manner as FIG. 1, this semi-transmissive-type liquid crystal display device has the same constitution as the embodiment shown in FIG. 1 up to the structure in which a transparent electrode 9 is formed over one of source/drain electrodes 7 of a thin film transistor on an insulation substrate 1. The constitution of a portion indicated by an arrow A in the drawing is similar to the corresponding constitution shown in FIG. 2 and FIG. 3. In this embodiment, an organic insulation layer 10 is formed after the transparent electrode 9 is formed and a reflection electrode 11 is formed by way of the organic insulation layer 10 in such a manner that a portion of the reflection electrode 11 is connected to the transparent electrode 9. The portion of the transparent electrode 9 which is not in contact with the reflection electrode 11 constitutes a transmissive-type pixel electrode and the reflection electrode 11 constitutes the reflection-type liquid crystal display device. Accordingly, the reflection electrodes 11 and the transparent electrodes 9 constitute the semi-transmissive type liquid crystal display device. Here, the semi-transmissive type liquid crystal display device can be also manufactured by assuming the transparent electrode 9 as a reflection electrode and forming an opening in a portion of the reflection electrode, or forming a reflection electrode instead of the transparent electrode 9 and forming an opening in a portion of the reflection electrode.

Figure 8:
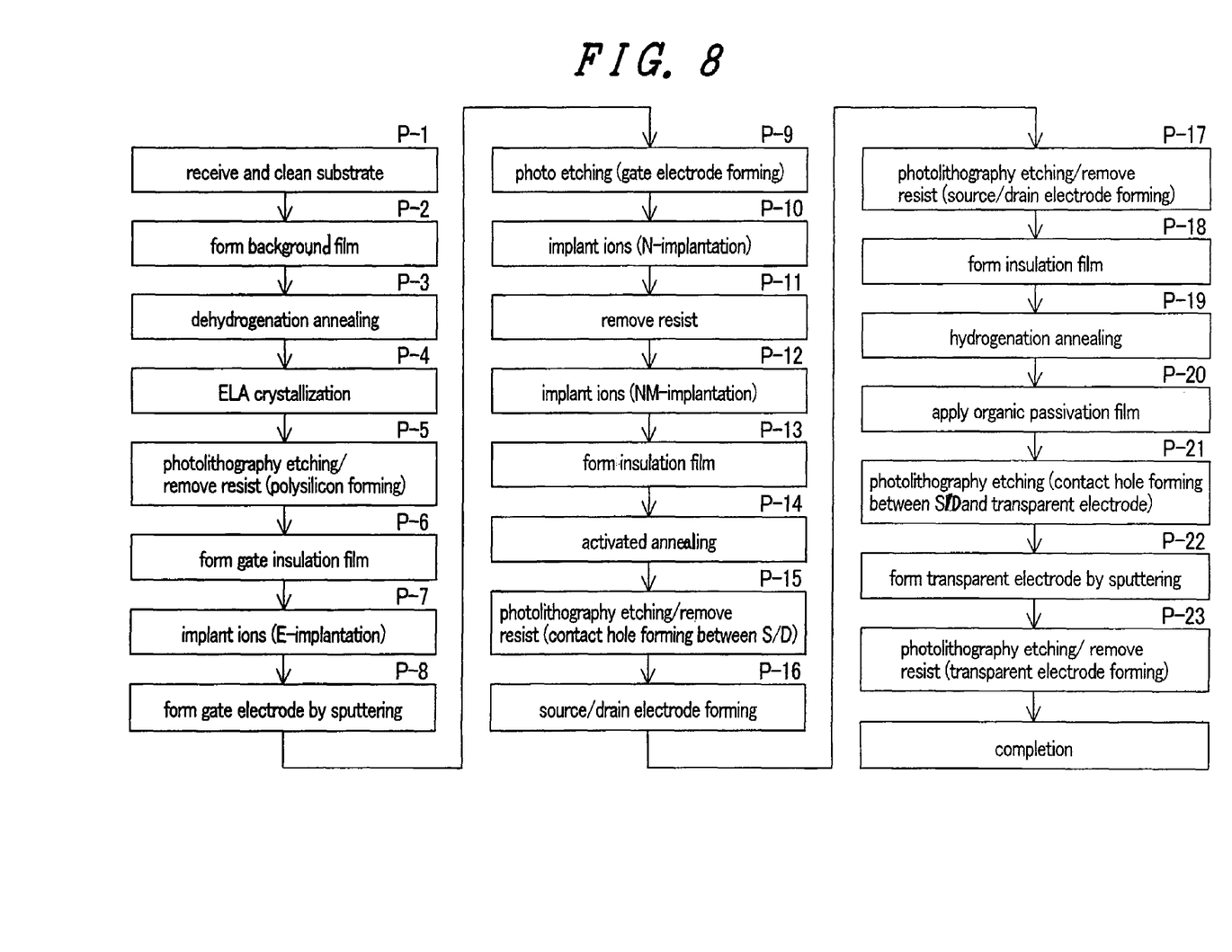
FIG. 8 is a flowchart for explaining a manufacturing method of the display device according to the present invention.
Figure 9:
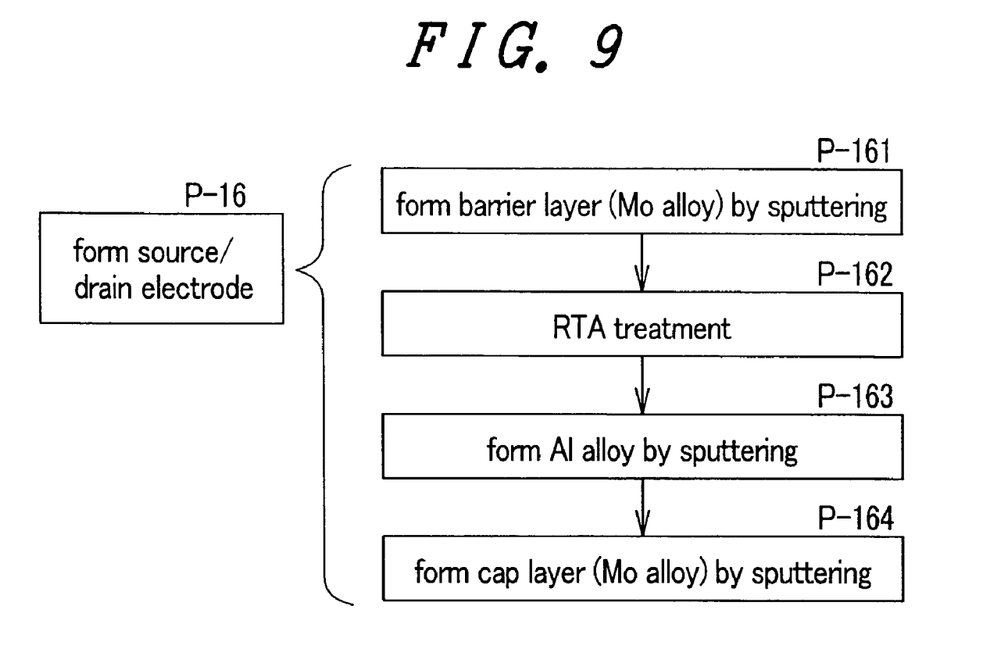
FIG. 9 is an explanatory view showing detailed steps of a source/drain electrode forming step in FIG. 8.

FIG. 8 is a flow chart for explaining the manufacturing method of the display device according to the present invention and FIG. 9 is an explanatory view of detailed steps of a source/drain electrode forming step of FIG. 8. In FIG. 8, firstly, an insulation substrate is received and cleaned (P-1). Background films (p-SiN, p-SiO) are formed over the cleaned insulation substrate and, at the same time, an amorphous silicon (a-Si) film is formed over the insulation substrate (P-2). Dehydrogenation annealing (P-3) and excimer laser annealing (ELA crystallization) are sequentially applied to the amorphous silicon film thus forming a polysilicon film (P-4). Thereafter, by applying a photolithography step, an etching step, a resist removing step on the polysilicon film, the polysilicon layer is patterned (polysilicon forming) (P-5).

A gate insulation layer (first insulation layer) is formed over the patterned polysilicon layer (P-6) and ion implantation (E implantation) is applied to the polysilicon layer (P-7) Gate electrodes are formed by sputtering at given positions on the polysilicon layer (P-8) and the gate electrodes are patterned by a photolithography step and an etching step (P-9). Thereafter, a mask is formed by resist coating and photolithography patterning. Then, ion implantation (N-implantation) (P-10), resist removing (P-11), ion implantation (NM implantation) (P-12), forming of a second insulation layer made of p-SiO (P-13), activated annealing (P-14) are sequentially performed. Then, a contact hole is formed between source/drain (S/D) electrodes by a photolithography step, an etching step and a resist removing step (P-15).

After forming the contact hole, a source/drain electrode forming step (P-16) is performed. With respect to the source/drain electrode forming step (P-16), as shown in FIG. 9, firstly, a barrier layer sputtering step (molybdenum or molybdenum alloy, molybdenum alloy in FIG. 9 (Mo alloy)) is performed (P-161). Then, a rapid heat annealing (RTA) step (P-162), an aluminum-based conductive layer sputtering step (Al alloy sputtering in the Figure.) (P-163), and a cap layer (Mo alloy in the Figure) sputtering step (P-164) are sequentially performed. Here, with respect to the aluminum-based conductive layer sputtering step (P-163) and the cap layer sputtering step (P-164), continuous sputtering is performed in this order.

After the source/drain electrode forming step, the source/drain electrode are patterned by a photolithography step, an etching step, and a resist removing step (P-17) and a third insulation layer made of p-SiN is formed over the source/drain electrode (P-18). An H2annealing (hydrogen termination treatment) is applied to the source/drain electrode (P-19). An organic insulation layer (organic passivation film in the Figure) is formed over the third insulation layer (P-20) and the contact hole for the source/drain electrode is formed by a photolithography step and an etching step (P-21).

The transparent electrode which is connected to the source/drain electrode via the contact hole is formed by sputtering (p-22), the transparent electrode is pattered by a photolithography step, and etching step, and resist removing step (p-23) and an active matrix substrate is completed. Here, with respect to the liquid crystal display device, the active matrix substrate and the counter substrate are laminated to each other and liquid crystal is sealed in lamination gap formed therebetween.

Figure 10A:
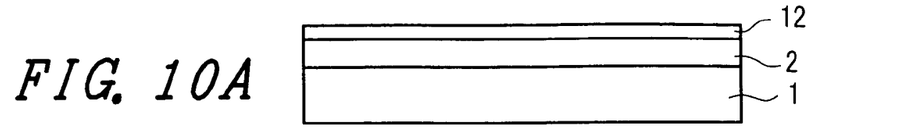
FIG. 10A to FIG. 10N are cross-sectional views of an essential part for further schematically explaining the manufacturing method of the display device according to the present invention.
Figure 10B:
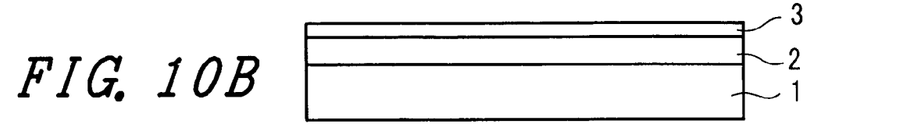
Figure 10C:
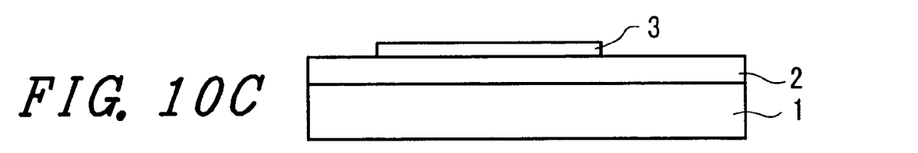
Figure 10D:
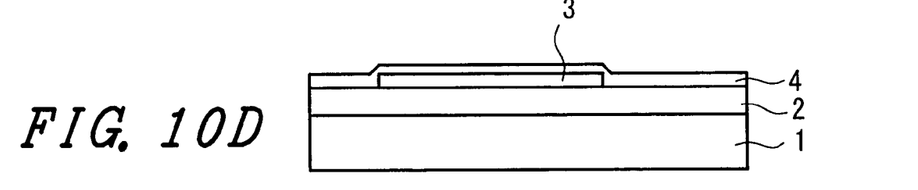
Figure 10E:
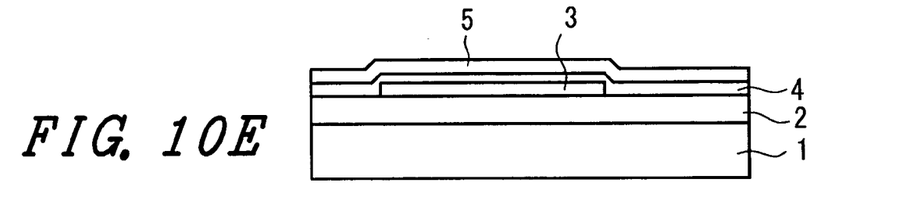
Figure 10F:
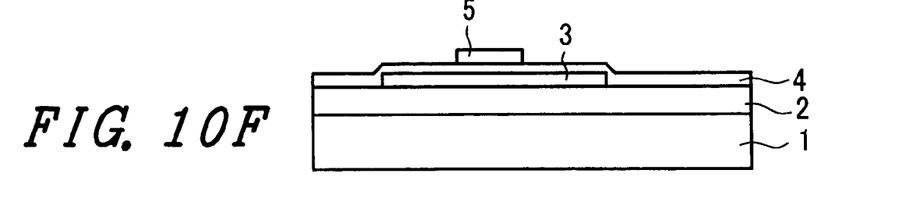

FIG. 10A to FIG. 10N are cross-sectional views of essential parts for further explaining schematically the manufacturing method of the display device according to the present invention which has been explained in FIG. 8 to FIG. 9. Firstly, the background layer 2 (including a first layer SiN, a second layer SiO) is formed over the insulation substrate 1 which is preferably made of glass. Then, an amorphous silicon (a-Si) layer 12 is formed over the background layers (FIG. 10A). The amorphous silicon layer 12 is crystallized (formed into polysilicon) by ELA (excimer laser annealing) (FIG. 10B). The polysilicon layer 3 is pattered to form a polysilicon layer 3 having a given island-shape by a photolithography step and an etching step (FIG. 10C). Over the patterned polysilicon layer 3, a gate insulation layer (TEOS) is formed as a first insulation layer 4 (FIG. 10D). Over the first insulation layer, an electrode layer which becomes a gate electrode is formed (FIG. 10E) and a gate electrode 5 is formed by the photolithography step and the etching step (FIG. 10F).

Figure 10G:
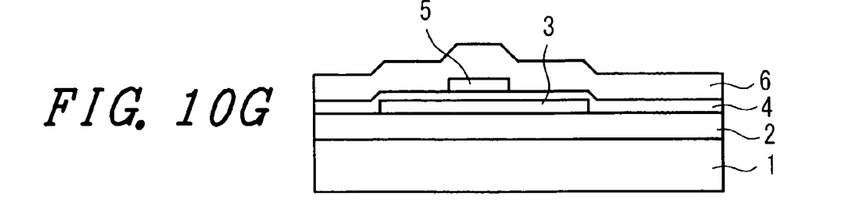
Figure 10H:
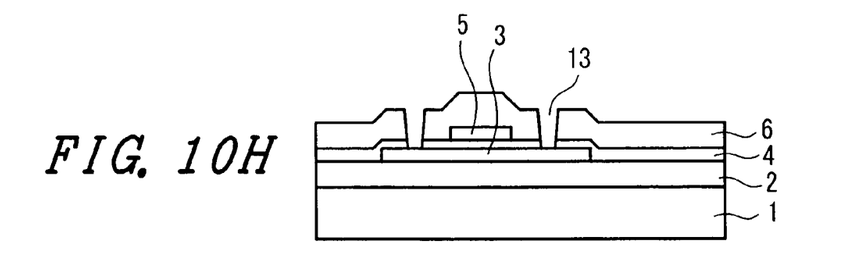
Figure 10I:
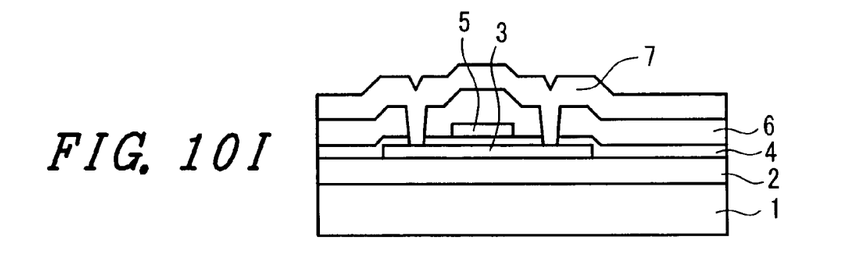
Figure 10J:
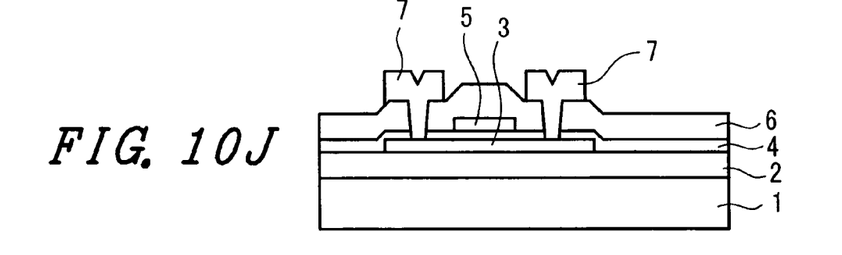
Figure 10K:
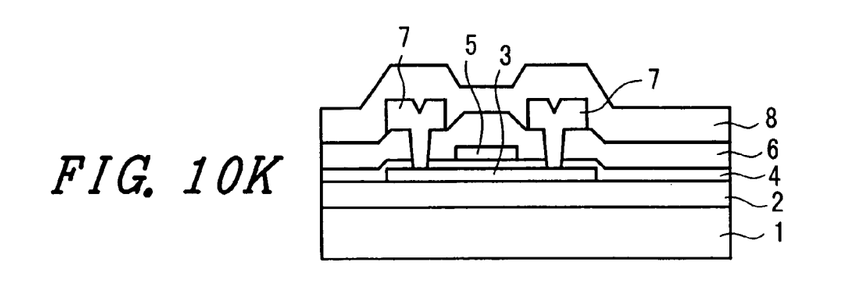

Next, a second insulation layer 6 made of SiO is formed over the gate electrode 5 (FIG. 10G). A contact hole 13 which penetrates this second insulation layer 6 and the gate insulation layer 4 is formed (FIG. 10H). Then, a source/drain electrode layer 7 is formed over the second insulation layer 6 (FIG. 10I). The formation of this source/drain electrode includes the steps which have been explained in conjunction with FIG. 9. The source/drain electrode 7 is patterned by applying a photolithography step and an etching step to the source/drain electrode layer (FIG. 10J). A third insulation layer 8 is formed over the source/drain electrode 7 (FIG. 10K).

Figure 10L:
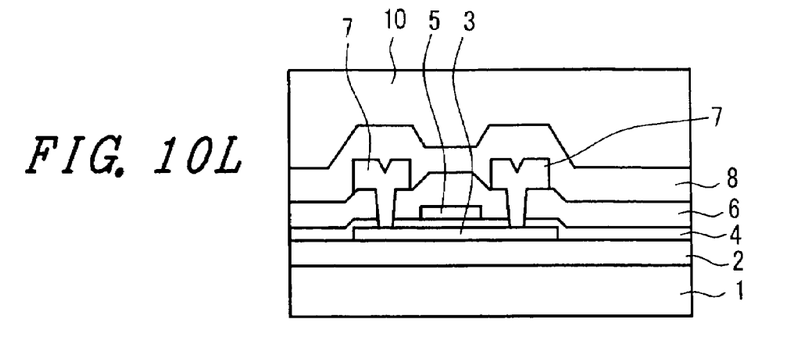
Figure 10M:
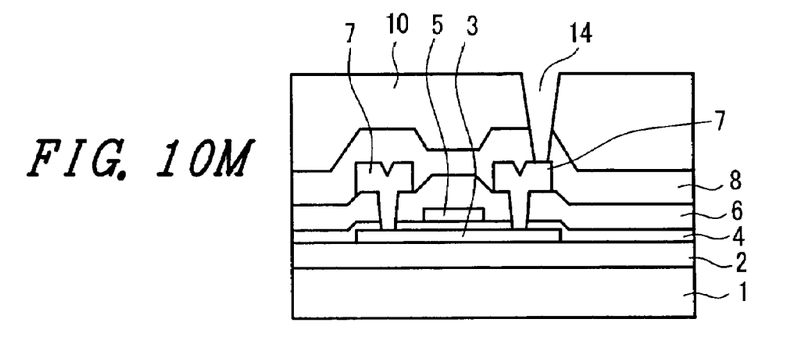
Figure 10N:
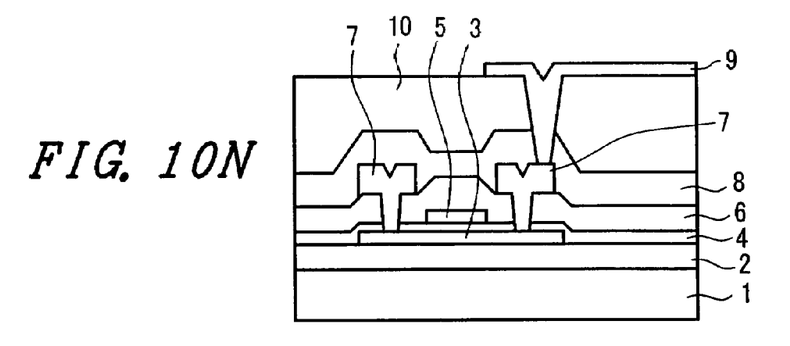

Next, an organic insulation layer 10 is formed over the third insulation layer 8 (FIG. 10L) and a contact hole 14 is formed at the position opposing one source/drain electrode 7 (FIG. 10M). A transparent electrode 9 is formed over the organic insulation layer 10 and is connected to the other source/drain electrode 7 through the contact hole 14 (FIG. 10N). In this manner, an active matrix substrate can be obtained.

Here, although the manufacturing method of the full-transmissive-type display device has been explained as a typical display device, the semi-transmissive-type display device shown in FIG. 7 has similar steps as FIG. 10A to FIG. 10N until the source/drain electrode forming step and the reflection electrode forming step is slightly different.

In the respective embodiments, although an active matrix substrate of a liquid crystal display device is explained as an example, it is needless to say that the present invention is not limited to the liquid crystal display device and can be applied to all display devices which have active matrix substrates such as an organic EL display device or the like.

As has been explained hereinabove, according to the invention, especially when an aluminum-based conductive layer is used for the source/drain electrode contacting with a low-temperature polysilicon, it is possible to provide a highly reliable display device which can prevent the diffusion of the aluminum element into the polysilicon layer in the heating step and can obviate defective display.

What is claimed is:

1. A manufacturing method of a display device comprising:
   a polysilicon pattern forming step for forming a polysilicon layer by patterning on a background layer of an insulation substrate having the background layer on a surface thereof;
   a first insulation layer forming step for forming a first insulation layer which covers the polysilicon layer;
   a gate electrode forming step for forming gate electrodes on the first insulation layer;
   a second insulation layer forming step for forming a second insulation layer such that the second insulation layer covers the gate electrodes;
   a contact hole forming step for forming contact holes which penetrate the second insulation layer and the first insulation layer; and
   a source/drain electrode forming step for forming source/drain electrodes which are connected to the polysilicon layer through the contact holes and are formed on the second insulation layer; wherein
   the manufacturing method further includes a heat treatment step in steps which come after the source/drain electrode forming step, and
   the source/drain electrode forming step further includes:
   a barrier layer forming step for forming a barrier layer by sputtering molybdenum or a molybdenum alloy;
   an oxide nitride film forming step for forming an oxide nitride film on a surface of the barrier layer by performing a rapid heat treatment of the barrier layer in a nitrogen atmosphere;
   a conductive layer forming step for forming a conductive layer by sputtering aluminum or an aluminum alloy layer; and
   a cap layer forming step for forming a cap layer by sputtering molybdenum or a molybdenum alloy on the conductive layer.

2. A manufacturing method of a display device according to claim 1, wherein the heat treatment step includes hydrogen termination treatment.

3. A manufacturing method of a display device according to claim 1, wherein the heat treatment step includes a CVD step.

* * * * *